United States Patent [19]
Goto et al.

[11] Patent Number: 5,770,988
[45] Date of Patent: Jun. 23, 1998

[54] THIN-FILM MULTILAYERED ELECTRODE AND METHOD OF FABRICATING SAME

[75] Inventors: Yoshihiko Goto, Shiga-ken; Masato Kobayashi, Ohmihachiman; Yukio Yoshino, Yokohama; Yuzo Katayama, Ohmihachiman, all of Japan

[73] Assignee: Murata Manufacturing Co., Ltd., Japan

[21] Appl. No.: 701,384

[22] Filed: Aug. 22, 1996

[30] Foreign Application Priority Data

Aug. 23, 1995 [JP] Japan ..................................... 7-239125

[51] Int. Cl.$^6$ ....................................................... H01P 3/18
[52] U.S. Cl. .......................... 333/236; 333/219; 333/238
[58] Field of Search ..................................... 333/202, 204, 333/219, 236, 238, 245, 246

[56] References Cited

U.S. PATENT DOCUMENTS

| 2,769,148 | 10/1956 | Clogston . | |
|---|---|---|---|
| 2,879,183 | 3/1959 | Doherty . | |
| 4,157,518 | 6/1979 | McCarthy | 333/236 X |
| 5,355,105 | 10/1994 | Angelucci, Jr. | 333/238 |

FOREIGN PATENT DOCUMENTS

| 9461566 | 3/1995 | Australia . |
|---|---|---|
| 9506336 | 3/1994 | WIPO . |

OTHER PUBLICATIONS

Raisbeck, G. and R.A. King, "Nonuniformities in laminated transmission lines", *Bell Telephone System Technical Publications*, 1959, pp. 1–60.

Brauer, W. G. Kienel and R. Wechsung, "Reproductible Methods for the Fabrication of Microwave Strip Lines of High Precision and Reliability", *Solid State Technology*, vol. 19, No. 12, Dec. 1976, pp. 67–73.

Davies, R. and B.H. Newton, "Microwave hybrid integrated circuit technology", *Wireless World*, vol. 84, No. 1506, Feb. 1978, pp. 46–67.

*Primary Examiner*—Paul Gensler
*Attorney, Agent, or Firm*—Ostrolenk, Faber, Gerb & Soffen, LLP

[57] ABSTRACT

A thin-film multilayered electrode of a high frequency electromagnetic field coupled type is disclosed. The thin-film multilayered electrode comprises thin-film conductors and dielectric thin films alternately stacked on a dielectric substrate so that a plurality of TEM mode transmission lines are multilayered. A film thickness of each of the dielectric thin films is set so that phase velocities of TEM waves which propagate through at least two of the plurality of TEM mode transmission lines are made substantially equal to each other, and a film thickness of each of the thin-film conductors is set so as to be smaller than a skin depth of a frequency which is used so that electromagnetic fields of at least two of the plurality of TEM mode transmission lines are coupled with each other. The thin-film conductors include at least one adhesive layer having a large adhesion strength at one or more of interfaces between the dielectric substrate and the thin-film conductor and the interfaces between the thin film conductors and the dielectric thin films.

6 Claims, 6 Drawing Sheets

THIN-FILM MULTILAYERED ELECTRODE AND METHOD OF FABRICATING SAME

BACKGROUND OF THE INVENTION

1. Field of the Invention

The present invention relates to a thin-film electrode and, more particularly, to thin-film multilayered electrodes used in RF (radio frequency) transmission lines, RF resonators, RF filters, and so on and also to a method of fabricating the thin-film multilayered electrodes.

2. Description of the Related Art

A high frequency electromagnetic field coupled type thin-film multilayered electrode (hereinafter simply referred to as the "thin-film multilayered electrode") is disclosed in the International Publication No. WO 95/06336 which was filed on Mar. 7, 1994 as the International Patent Application No. PCT/JP94/00357 and is assigned to Murata Manufacturing Co., Ltd.

Specifically, as shown in FIG. 1, a thin-film multilayered electrode 101 includes thin-film conductors 121 to 125 and thin-film dielectrics 131 to 134 alternately stacked on a dielectric substrate 110. The pairs of thin film conductors 121 and 122, 122 and 123, 123 and 124, and 124 and 125 and the thin film dielectrics 131 to 134 sandwiched therebetween constitute a plurality of TEM mode transmission lines L2 to L5, respectively. The thin-film multilayered electrode 101 constitutes a micro-strip line in cooperation with a ground conductor 111 formed on the bottom surface of the dielectric substrate 110.

Based on the number of layers of the thin-film conductors 121 to 125 and the thin-film dielectrics 131 to 134, a film thickness of each of the thin-film dielectrics 131 to 134 is set so that phase velocities of TEM waves which propagate through at least two of the plurality of TEM mode transmission lines L2 to L5 are made substantially equal to each other. Moreover, based on the number of layers of the thin-film conductors 121 to 125 and the thin-film dielectrics 131 to 134, a film thickness of each of the thin-film conductors 121 to 125 is set so as to be smaller than a skin depth of a frequency which is intended to be used, so that electromagnetic fields of at least two of the plurality of TEM mode transmission lines L2 to L5 are coupled with each other.

In the thin-film multilayered electrode 101, when the TEM mode transmission lines L2 to L5 are excited by a high frequency signal, each of the thin-film conductors 121 to 125 transmits a part of the high frequency power incident thereon via an adjacent thin-film dielectric to a thin-film conductor adjacent in a different direction, while reflecting a part of the high frequency power into the adjacent thin-film conductor via the thin-film dielectric. Within the thin-film dielectrics 131 to 134 each of which is sandwiched by two adjacent thin-film conductors 121 and 122, 122 and 123, 123 and 124, and 124 and 125, the reflection wave and transmission wave resonate, while two oppositely directed high frequency currents flow in the vicinity of the upper and lower surfaces of the thin-films conductors 121 to 125. Therefore, since the film thickness of each of the thin-film conductors 121 to 125 is smaller than the skin depth, the two oppositely directed high frequency currents interfere with each other, and are canceled by each other except for a remaining part thereof. In this way, in the thin-film multilayered electrode 101, a resonance energy or a transmission energy in adjacent thin-film dielectrics 131 to 134 is coupled with each other via the thin-film conductors 121 to 125. On the other hand, the thin-film dielectrics 131 to 134 have a displacement current generated by an electromagnetic field, which causes a high frequency current to be generated at the surface of their adjacent thin-film conductors 121 to 125.

Furthermore, since phase velocities of TEM mode waves which propagate through at least two of the plurality of TEM mode transmission lines L2 to L5 are made substantially equal to one another, high frequency currents flowing through the thin film conductors 121 to 125 are substantially in phase with each other. As a result of this, the high frequency currents flowing in the thin-film conductors 121 to 125 in phase increase the effective skin depth. Therefore, when excitation is effected by a high frequency signal, an electromagnetic energy of the high frequency signal is transferred to an adjacent transmission line through an electromagnetic coupling of the adjacent TEM mode transmission lines L2 to L5 whose electromagnetic fields are coupled, while the electromagnetic energy propagates in the longitudinal direction of the transmission lines L2 to L5. In this case, the electromagnetic energy of high frequency propagates in the longitudinal direction of the lines through the electrically coupled transmission lines L2 to L5. Thus, the skin depth is effectively increased and conductor loss and the surface resistance can be reduced, with remarkably reduced external dimensions.

Thus, use of the thin-film multilayered electrode makes it possible to offer high frequency transmission lines with smaller transmission loss, high frequency resonators or high frequency filters having an extremely large no-loaded Q, or high frequency devices having small size and weight.

In the thin-film multilayered electrode 101, the thin-film conductors are made of a single material of a high conductivity such as Cu or Ag. However, Cu and Ag used for the conductive thin films have the following problems, which are caused by the fact that they weakly adhere to oxides forming the dielectric thin films and dielectric substrate:

(1) During fabrication of the thin-film multilayered electrode, the films may peel off.

(2) After fabrication of the thin-film multilayered electrode, environmental conditions are varied repeatedly, whereby stress is accumulated in the electrode. As a result, the films may peel off.

(3) Stress is accumulated in the electrode because of thermal distribution created during the use of the electrode and because a temperature difference is created between a time when the electrode is used and a time when it is not used. As a result, the films may peel off.

SUMMARY OF THE INVENTION

It is therefore an object of the invention to solve the foregoing problems and provide a highly reliable thin-film multilayered electrode in which conductive thin films are adhered strongly in intimate contact with a dielectric substrate or with dielectric thin films. It is another object of the invention to provide a method of fabricating the thin-film multilayered electrode.

A thin-film multilayered electrode according to the present invention may comprise thin-film conductors and dielectric thin films alternately stacked on a dielectric substrate so that a plurality of TEM mode transmission lines are multilayered. Each pair of the thin-film conductors the dielectric thin film sandwiched therebetween constituting a TEM mode transmission line. Based on a number of multilayered layers of the thin-film conductors and the dielectric thin films, a film thickness of each of the dielectric thin films is set so that phase velocities of TEM waves which propagate through at least two of the plurality of TEM mode transmission lines are made substantially equal to each other. Further, based on the number of multilayered layers of the thin-film conductors and the dielectric thin films, a film thickness of each of the thin-film conductors is set so as to be smaller than a skin depth at a frequency which is to be used, so that electromagnetic fields of at least two of the plurality of TEM mode transmission lines are coupled with each other. The thin-film multilayered electrodes further include at least one adhesive layer having a large adhesion strength at one or more of the interfaces between the dielectric substrate and the thin-film conductor, and/or the interfaces between the thin film conductors and the dielectric thin films.

As described above, in the thin-film multilayered electrode according to the invention, an adhesive layer or layers of great adhesion strength are placed in the position of at least one of the above-mentioned interfaces. The strength of adhesion between the successive thin films forming the thin-film multilayered electrode is thereby increased. This can enhance the reliability of the electrode.

For the purpose of illustrating the invention, there are shown in the drawings several forms which are presently preferred, it being understood, however, that the invention is not limited to the precise arrangements and instrumentalities shown.

DETAILED DESCRIPTION OF EMBODIMENTS OF THE INVENTION

The inventors of the present invention have conducted various experiments and studied abut methods of improving the strength with which the conductive thin films adhere to the dielectric substrate and to the dielectric thin films. It has been discovered that the strength is improved by placing an adhesive layer or layers of Ti or the like at the interface between the conductive thin film and the dielectric substrate or at the interfaces between the conductive thin films and the dielectric thin films.

That is, a thin-film multilayered electrode according to the present invention comprises a dielectric substrate on which conductive thin films and dielectric thin films are alternately multilayered. This thin-film multilayered electrode is characterized in that an adhesive layer having a large adhesion strength is placed at one or more of the interfaces between the dielectric substrate and the overlying conductive thin film and/or the interfaces between the conductive thin films and the dielectric thin films.

In the thin-film multilayered electrode according to the present invention, the adhesive layer having a large adhesion strength is a layer or thin film which provides larger adhesion strength when placed in the position of at least one of the above-mentioned interfaces, than if the conductive thin films were directly bonded to the dielectric substrate or to the dielectric thin films.

It is preferable that the material of the adhesive layer or layers of the thin-film multilayered electrode be at least one species selected from the group consisting of Ti, Cr, Ni, and alloys containing at least one of them. The adhesive layer has preferably a thickness of more than 20 nm.

A method of fabricating the thin-film multilayered electrode according to the invention is characterized in that the conductive thin films, the adhesive layer or layers, and the dielectric thin films are formed by continuous process steps under a vacuum without breaking the vacuum during the process steps.

Figure 1:
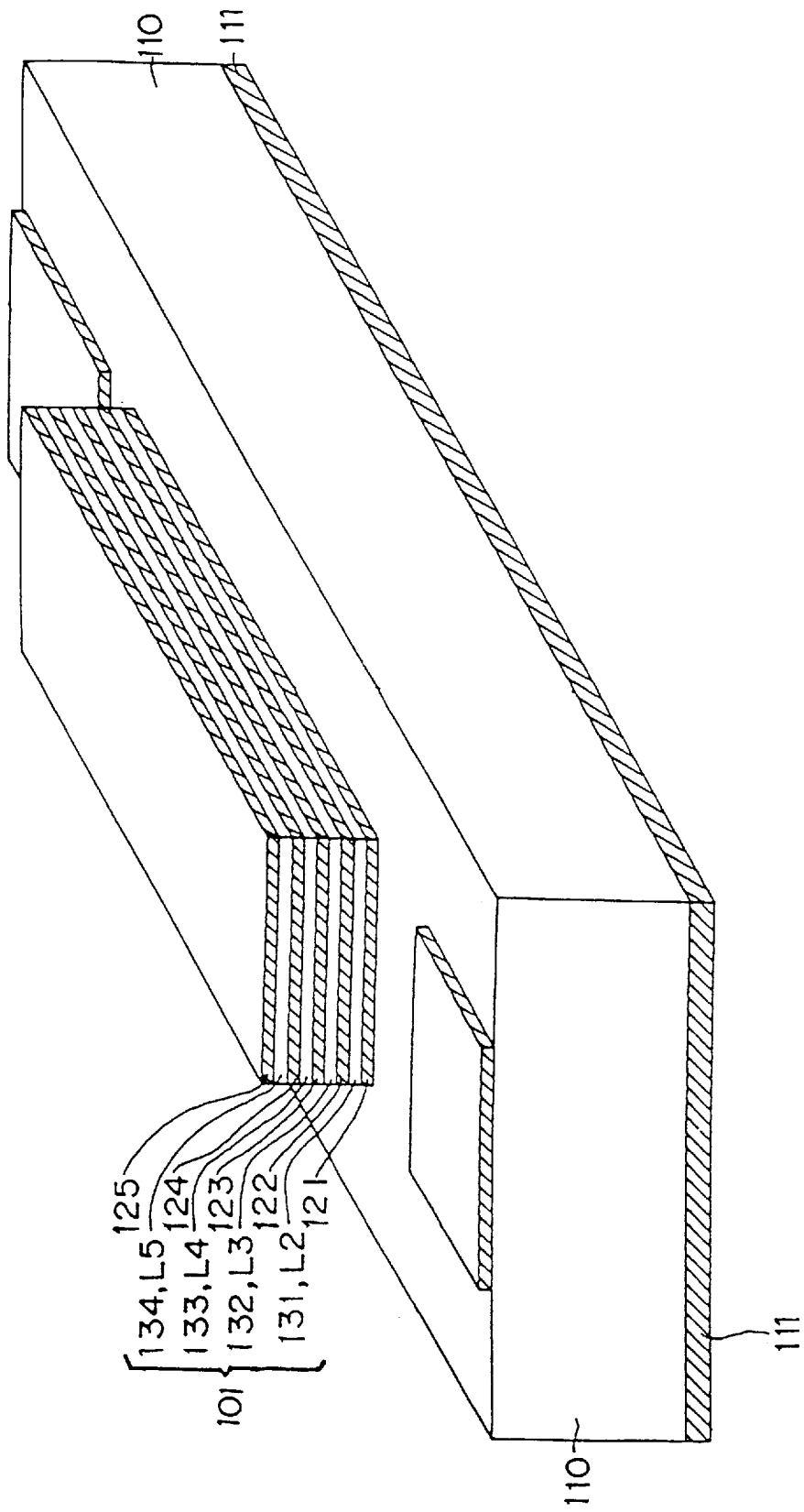
FIG. 1 is a perspective view of a conventional thin-film multilayered electrode and micro-strip lines.
Figure 2:
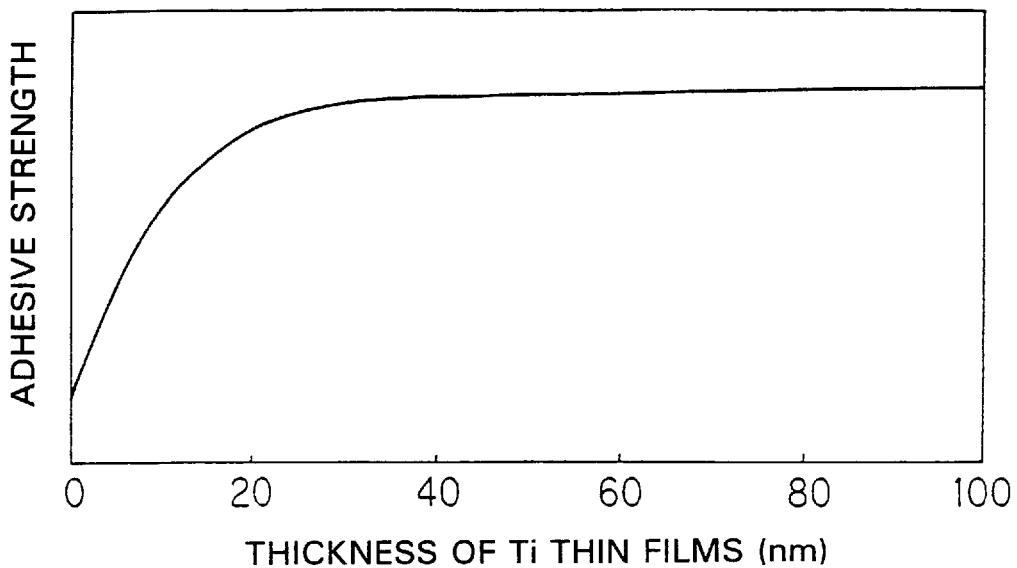
FIG. 2 is a diagram showing the relation between the thickness of Ti thin films which can serve as adhesive layers and their adhesion strength.

For example, where a thin Cu film having a film thickness of 1 μm was formed as a conductive thin film on a glass substrate, or a dielectric substrate, a thin film of Ti was placed as an adhesive layer at the interface between the glass substrate and the Cu thin film. The relation of the film thickness of the Ti thin film and the adhesion strength obtained in this case is shown in FIG. 2. It can be seen from FIG. 2 that when the film thickness of the Ti thin film was less than about 20 nm, the adhesion strength was insufficient. In addition, a slight change in the film thickness resulted in a great variation of the adhesion strength. However, it was observed that as long as the thickness was more than about 20 nm, the adhesion strength was sufficiently large. Furthermore, the stability was improved since the adhesion strength was substantially constant.

A thin-film multilayered electrode was fabricated by alternately laminating conductive thin films (Cu thin films) and dielectric thin films (glass thin films) on a dielectric substrate (glass substrate). An adhesive tape was stuck to the thin-film multilayered electrode and peeled off. Where thin films of Ti having film thicknesses of less than 20 nm were placed at the interface between the dielectric substrate (glass substrate) and the conductive thin film (Cu thin film) and at the interfaces between the conductive thin films (Cu thin films) and the dielectric thin films (glass thin films), peeling of the multilayered films was observed. Where thin films of Ti having film thicknesses of more than 20 nm were placed, no peeling of the multilayered films was observed.

Figure 3:
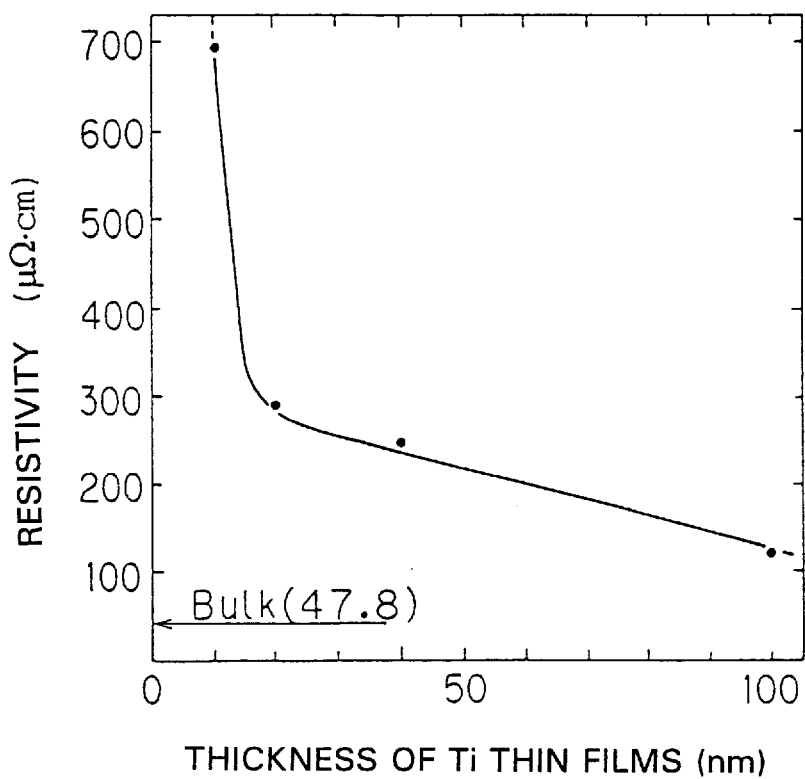
FIG. 3 is a diagram showing the relation between the thickness of Ti thin films which can serve as adhesive layers and their resistivity.

Thin films of Ti having various film thicknesses were formed on glass substrates by sputtering techniques, and their resistivities were measured. The results are shown in FIG. 3. It can be seen from FIG. 3 that where the film thicknesses of the Ti thin films were less than about 20 nm, the electrical resistivities were rapidly increased and that a slight deviation from the designed film thickness greatly affects the characteristics of the thin-film multilayered electrode with undesirable results. On the other hand, where the film thicknesses of the Ti thin films were more than about 20 nm, the resistivities were low. In addition, the stability was enhanced since the resistivity did not vary greatly with the thickness. Hence, a slight deviation from the designed film thickness does not greatly affect the characteristics. It can be seen that this structure can be advantageously applied to an RF electromagnetically coupled thin-film multilayered electrode or the like.

In the present invention, a preferred material constituting the adhesive layer is not limited to the aforementioned Ti. Other usable species of materials include Cr, Ni, and alloys containing at least one of them. For these materials, the relations among the film thickness, the adhesion strength, and the resistivity show tendencies similar to the above-described tendencies of Ti.

Ti, Cr, Ni, and other materials tend to combine with oxygen and result in increased resistivities. Therefore, films are preferably continuously formed in a vacuum. Specifically, a good thin-film multilayered electrode having a low resistivity can be manufactured by continuously forming the adhesive layers, the conductive thin films in contact with the adhesive layers, and the dielectric thin films in a vacuum without breaking the vacuum during the process steps.

Hereinafter, two embodiments of the present invention are explained in more detail with reference to the drawings.

EXAMPLE 1

Figure 4A:
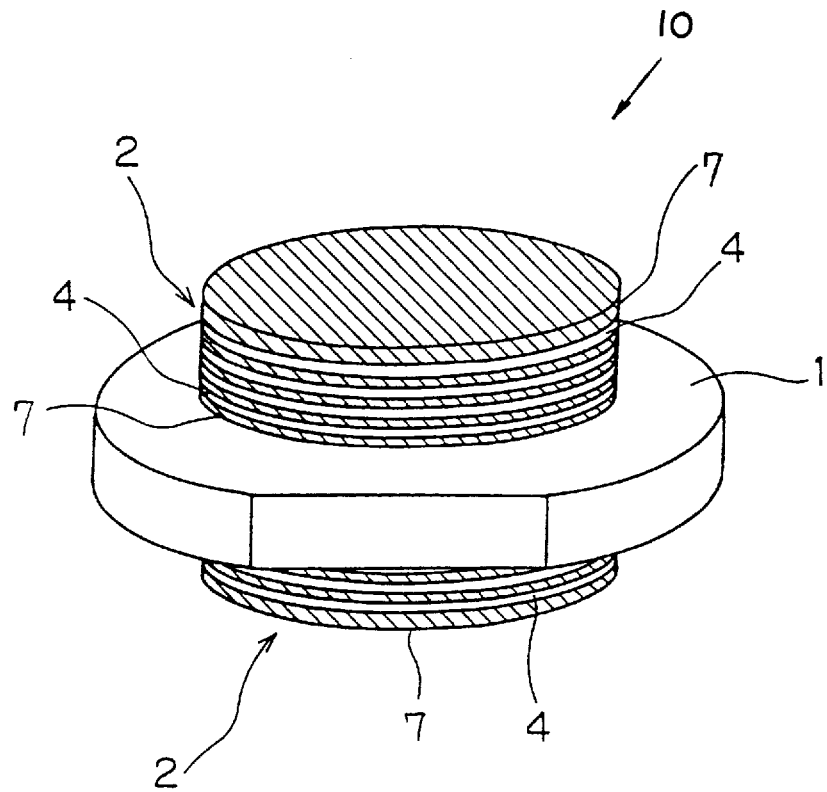
FIG. 4A is a perspective view showing a circular TM mode resonator equipped with a thin-film multilayered electrode according to a first example of the invention.

FIG. 4A is a perspective view showing a circular TM mode resonator 10 comprising a dielectric substrate on which thin-film multilayered electrodes (a high frequency electromagnetic field coupled type thin-film multilayered electrode) according to one example of the invention are disposed.

In the circular TM mode resonator 10, a substantially circular R-surface sapphire substrate is used as the dielectric substrate 1. The thin-film multilayered electrodes 2 are disposed on both faces of the substrates, respectively.

Figure 4B:
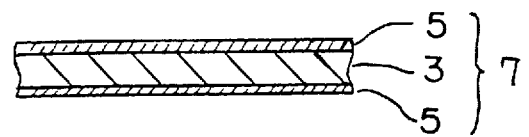
FIG. 4B is a partial cross-sectional view of a thin-film conductor used in the circular TM mode resonator shown in FIG. 4A.

The thin-film multilayered electrodes 2 are formed by alternately stacking thin-film conductors 7 and dielectric thin films 4 of $SiO_2$. As shown in FIG. 4B, the thin-film conductor 7 includes a conductive film 3 consisting essentially of Cu and a pair of adhesive layers 5 consisting essentially of Ti or Cr and interposing the conductive film 3. Thus, as shown in FIG. 5D, the adhesive layers 5 are disposed at the interface between the dielectric substrate 1 and the conductive thin film 3 and at the interface between the conductive thin film 3 and the dielectric thin film 4. Each pair of the thin-film conductors 7 and the dielectric thin film 4 sandwiched therebetween constitutes a TEM mode transmission line, therefore, each of the thin-film multilayered electrodes 2 includes a plurality of TEM mode transmission lines.

Based on a number of multilayered layers of the thin-film conductors 7 and the dielectric thin films 4, a film thickness of each of the dielectric thin films 4 is set so that phase velocities of TEM waves which propagate through at least two of the plurality of TEM mode transmission lines are made substantially equal to each other. Moreover, based on the number of multilayered layers of the thin-film conductors 7 and the dielectric thin films 4, a film thickness of each of the thin-film conductors 7 is set so as to be smaller than a skin depth of a frequency which is to be used so that electromagnetic fields of at least two of the plurality of TEM mode transmission lines are coupled with each other.

A method of fabricating the aforementioned circular TM mode resonator is next described.

Figure 5A:
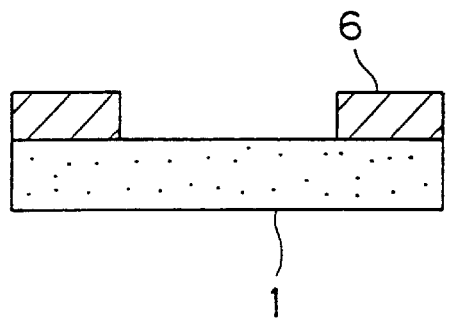
FIGS. 5A to 5F are views illustrating a method of fabricating circular TM mode resonators equipped with thin-film multilayered electrodes according to the first example of the invention.

(1) As shown in FIG. 5A, a metal mask 6 having a desired pattern is mounted on the dielectric substrate 1. The inside of a film formation chamber of sputtering equipment (not shown) is evacuated to a vacuum.

(2) Then, the adhesive layer 5 of Ti or Cr (FIG. 5B) is formed on the dielectric substrate 1 by sputtering a target of Ti or Cr.

Figure 5B:
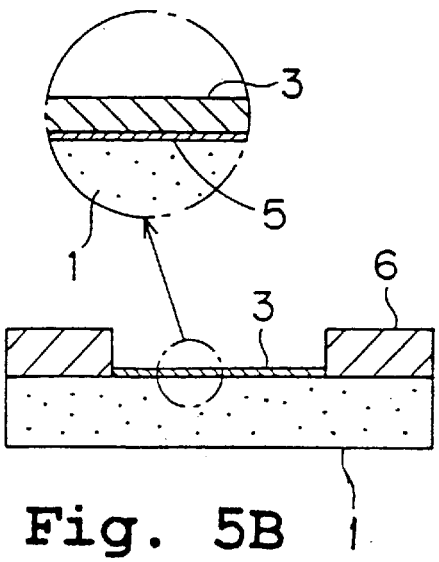

(3) Then, as shown in FIG. 5B, the first layer of conductive thin film 3 of Cu is formed on the adhesive layer 5 overlying the dielectric substrate 1 by sputtering a target of Cu.

(4) Subsequently, the adhesive layer 5 (FIG. 5C) is formed on the conductive thin film 3 by sputtering a target of Ti or Cr.

Figure 5C:
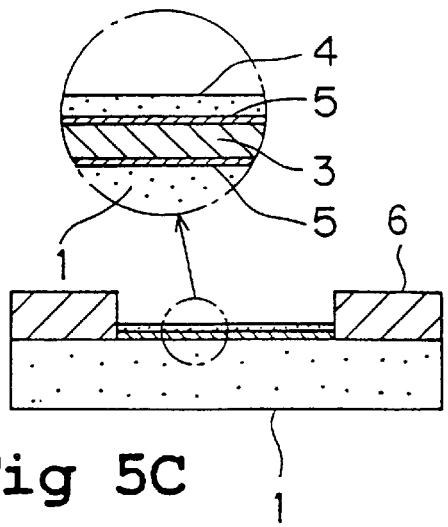
Figure 5D:
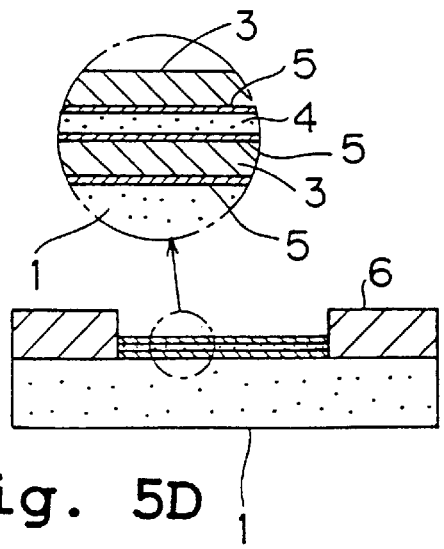

(5) Then, as shown in FIG. 5C, the dielectric thin film 4 (thin film of $SiO_2$) is formed on the adhesive layer 5 overlying the conductive thin film 3 by sputtering a target of $SiO_2$.

(6) Then, the adhesive layer 5 is again formed on the dielectric thin film 4 by sputtering a target of Ti or Cr, as shown in FIG. 5D.

Figure 5E:
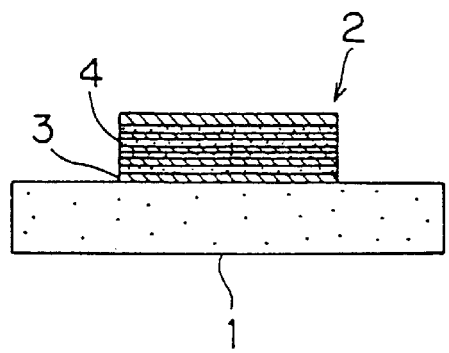

(7) Then, the above-explained operations (3)–(6) are repeated to form each thin-film multilayered electrode 2 consisting of five layers of conductive thin films 3, as shown in FIG. 5E.

Figure 5F:
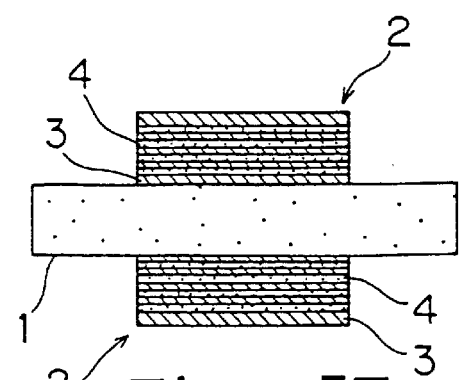

(8) Then, the film formation chamber is opened to the atmosphere, and the operations (1)–(7) above are repeated. The thin-film multilayered electrode 2 is also formed on the other surface of the dielectric substrate 1, as shown in FIG. 5F, thus fabricating the circular TM mode resonator shown in FIG. 4A.

The sputtering operations of the manufacturing steps for forming the adhesive layers, conductive thin films, and dielectric thin films of the above example are performed under the conditions listed in Table 1.

TABLE 1

| target | Cu | $SiO_2$ | Ti | Cr |
|---|---|---|---|---|
| sputtering gas | Ar | $Ar/O_2$ | Ar | Ar |
| gas flow rate (cc/min) | 18 | 18/10 | 100 | 100 |
| gas pressure | $1.0 \times 10^{-3}$ | $1.4 \times 10^{-3}$ | $9.0 \times 10^{-3}$ | $9.0 \times 10^{-3}$ |
| background (torr) | less than $1.0 \times 10^{-6}$ | less than $1.0 \times 10^{-6}$ | less than $1.0 \times 10^{-6}$ | less than $1.0 \times 10^{-6}$ |
| substrate temperature (°C.) | 150 | 150 | 150 | 150 |
| RF power (W) | 600 | 600 | 600 | 600 |

As a comparative example, a circular TM mode resonator having no adhesive layer was fabricated by a process similar to the above-described method.

Table 2 shows the film thicknesses of conductive thin films, the film thicknesses of dielectric thin films, the presence or absence of adhesive layers, the kinds of the adhesive layers, the film thicknesses of the adhesive layers, and the thicknesses of the dielectric substrates of the circular TM mode resonators of the above example and of the comparative example having a resonance frequency of 3.0 GHz.

TABLE 2

| | sample | | |
|---|---|---|---|
| | 1 (comparative example) | 2 (example) | 3 (example) |
| thickness of conductive thin films (μm) | 0.525 | 0.509 | 0.496 |
| thickness of dielectric thin films (μm) | 0.401 | 0.450 | 0.440 |
| presence or absence of adhesive layers | absence | presence | presence |
| kind of adhesive layers | — | Ti | Cr |
| thickness of adhesive layers (μm) | — | 0.040 | 0.040 |
| thickness of dielectric substrate (μm) | 330 | 330 | 330 |
| result of peeling test | peeling occurred | no peeling | no peeling |

In order to examine the adhesion strengths of the thin-film multilayered electrodes of the circular TM mode resonators of the above examples and of the comparative example, peeling tests were performed. That is, an adhesive tape was stuck to the thin-film multilayered electrodes 2 and peeled off. The results are also shown in Table 2. As shown in Table 2, peeling was observed in the thin-film multilayered electrode of the circular TM mode resonator of the comparative example where no adhesive layers were arranged. However, no peeling was observed at all in the thin-film multilayered electrodes of the circular TM mode resonators of the examples.

EXAMPLE 2

Figure 6A:
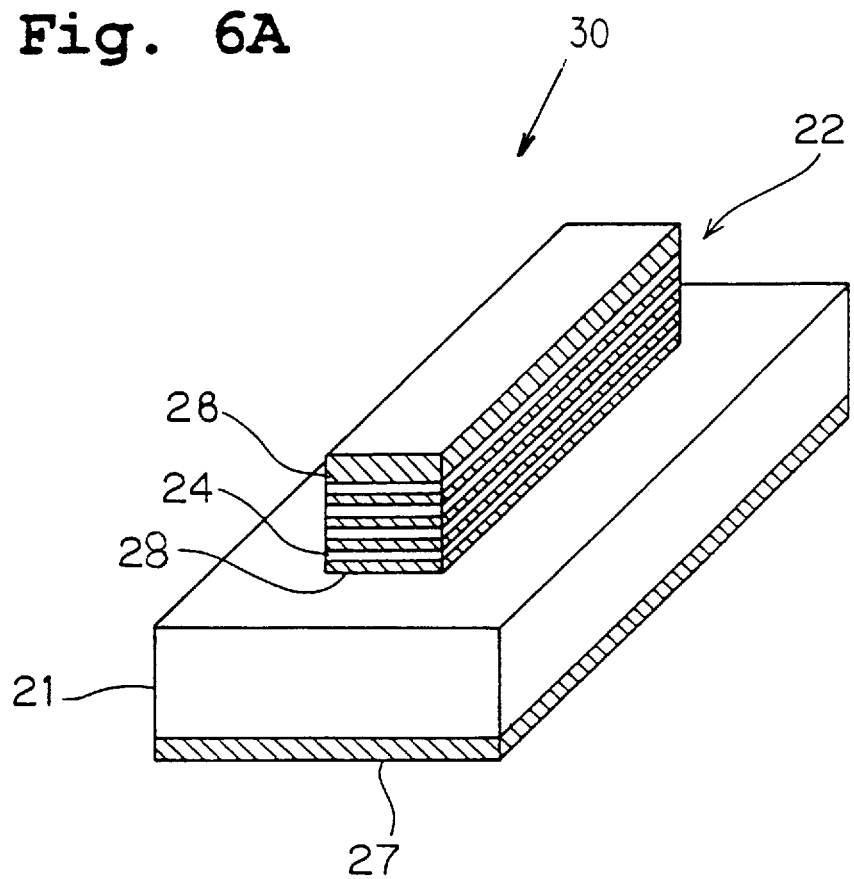
FIG. 6A is a perspective view of a microstrip line resonator equipped with a thin-film multilayered electrode according to a second example of the invention.

FIG. 6A is a perspective view showing a microstrip line resonator 30 having a dielectric substrate on which thin-film multilayered electrodes according to another example of the invention are disposed.

This microstrip line resonator 30 has a dielectric substrate 21. An R-surface sapphire substrate which is rectangular in its two-dimensional shape is used as the dielectric substrate 21. A thin-film multilayered electrode 22 is disposed on the top surface. A ground electrode 27 is disposed on the bottom surface.

Figure 6B:
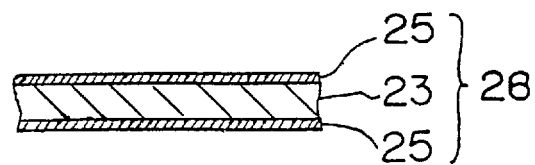
FIG. 6B is a partial cross-sectional view of a thin-film conductor used in the microstrip line resonator shown in FIG. 6A.
Figure 7A:
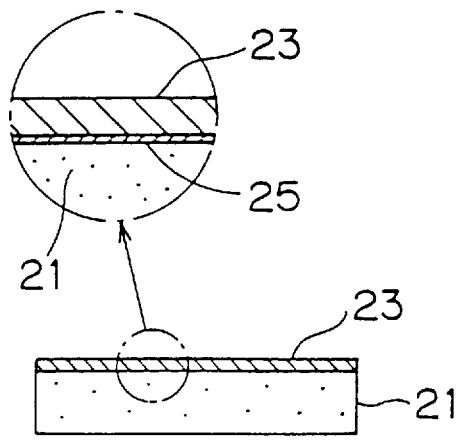
FIGS. 7A to 7F are views illustrating a method of fabricating microstrip line resonators equipped with thin-film multilayered electrodes according to the second example of the invention.

The thin-film multilayered electrode 22 is formed by alternately stacking thin-film conductors 28 and dielectric thin films 24 of $SiO_2$. As shown in FIG. 6B, the thin-film conductor 28 includes a conductive film 23 consisting essentially of Cu and a pair of adhesive layers 25 consisting essentially of Ti or Cr and interposing the conductive film 3. Thus, as shown in FIG. 7C, the adhesive layers 25 are disposed at the interface between the dielectric substrate 21 and the conductive thin film 23 and at the interface between the conductive thin film 23 and the dielectric thin film 44. Each pair of the thin-film conductors 28 and the dielectric thin film 24 sandwiched therebetween constitutes a TEM mode transmission line, therefore, the thin-film multilayered electrodes 22 includes a plurality of TEM mode transmission lines.

Based on a number of multilayered layers of the thin-film conductors 28 and the dielectric thin films 24, a film thickness of each of the dielectric thin films 24 is set so that phase velocities of TEM waves which propagate through at least two of the plurality of TEM mode transmission lines are made substantially equal to each other. Moreover, based on the number of multilayered layers of the thin-film conductors 28 and the dielectric thin films 24, a film thickness of each of the thin-film conductors 28 is set so as to be smaller than a skin depth of a frequency which is to be used so that electromagnetic fields of at least two of the plurality of TEM mode transmission lines are coupled with each other.

A method of fabricating the above-described microstrip line resonator is next described.

(1) The dielectric substrate 21 is put into the film formation chamber of sputtering equipment (not shown). The inside is evacuated to a desired degree of vacuum. The adhesive layer 25 of Ti (FIG. 7A) is formed on the dielectric substrate 21 by sputtering a target of Ti. Then, the first layer of conductive thin film 23 of Cu is formed on the adhesive layer 25 overlying the dielectric substrate 21 by sputtering a target of Cu, as shown in FIG. 7A.

(2) Subsequently, the adhesive layer 25 (FIG. 7B) is formed on the conductive thin film 23 by sputtering a target of Ti.

Figure 7B:
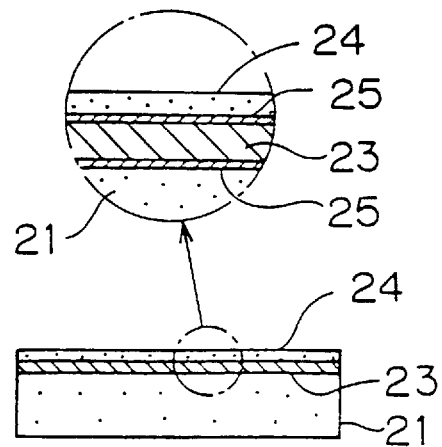
Figure 7C:
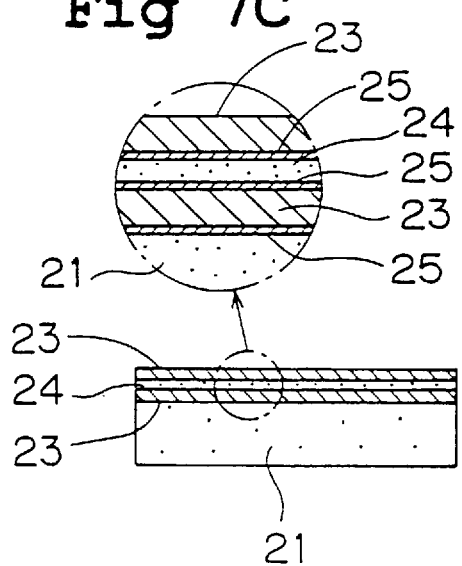

(3) Then, the dielectric thin film 24 (thin film of $SiO_2$) is formed on the adhesive layer 25 overlying the conductive thin film 23 by sputtering a target of $SiO_2$, as shown in FIG. 7B.

(4) Then, the adhesive layer 25 (FIG. 7C) is formed on the dielectric thin film 24 by sputtering a target of Ti. Then, as shown in FIG. 7C, the conductive thin film 23 is formed on the adhesive layer 25 overlying the dielectric thin film 24.

Figure 7D:
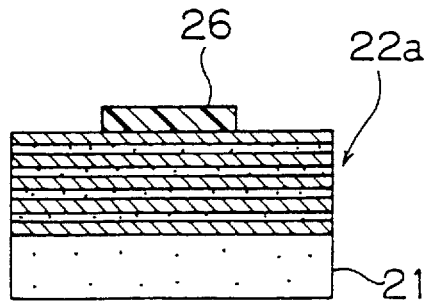
Figure 7E:
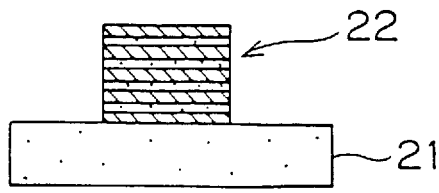

(5) Then, the above-explained operations (2)–(4) are repeated to form a thin-film multilayered electrode 22a having the five conductive thin films 23, as shown in FIG. 7D. Thereafter, photoresist 26 is patterned and the thin-film multilayered electrode 22a is etched to form the thin-film multilayered electrode 22 as shown in FIGS. 7D and 7E.

Figure 7F:
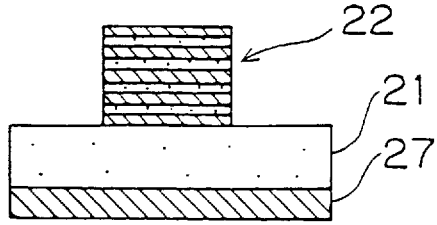

(6) Then, as shown in FIG. 7F, the grounding electrode 27 is formed on the bottom surface of the dielectric substrate 21, thus obtaining the microstrip line resonator as shown in FIG. 6A.

The conditions under which the sputtering operations of the method of fabricating the thin-film multilayered electrode of this example 2 are the same as the conditions of the above-described example 1.

As a comparative example, a microstrip line resonator having no adhesive layers was fabricated in a manner similar to the above-described method.

Table 3 shows the film thicknesses of conductive thin films, the film thicknesses of dielectric thin films, the presence or absence of adhesive layers, the kinds of the adhesive layers, the film thicknesses of the adhesive layers, and the thicknesses of the dielectric substrates of the microstrip line resonators of the above examples and of the comparative example having a resonance frequency of 2.0 GHz.

TABLE 3

| | sample | |
|---|---|---|
| | 4 (comparative example) | 5 (example) |
| thickness of conductive thin films (μm) | 0.97 | 0.936 |
| thickness of dielectric thin films (μm) | 1.13 | 0.863 |
| presence or absence of adhesive layers | absence | presence |
| kind of adhesive layers | — | Ti |
| thickness of adhesive layers (μm) | — | 0.040 |
| thickness of dielectric substrate (μm) | 330 | 330 |
| result of peeling test | presence | absence |

In order to examine the adhesion strengths of the thin-film multilayered electrodes of the microstrip line resonators of the above examples and of the comparative example, peeling tests were performed. That is, an adhesive tape was stuck to the thin-film multilayered electrodes 22 and peeled off. The results are also shown in Table 3. As shown in Table 3, peeling was observed in the thin-film multilayered electrode of the microstrip line resonator of the comparative example where no adhesive layers were arranged. However, no peeling was observed at all in the thin-film multilayered electrodes of the microstrip line resonators of the examples.

In the examples 1 and 2 above, the present invention of the subject application is applied to the thin-film multilayered electrodes of circular TM mode resonators and of microstrip line resonators. The thin-film multilayered electrode according to the invention and a method of fabricating it are not limited to resonators. The invention can find wide application such as thin-film multilayered electrodes of other electronic parts and methods of fabricating them.

In the above examples 1 and 2, the adhesive layers are made of Ti or Cr. The material of the adhesive layers is not limited to these. Various materials such as Ni and alloys containing at least one of Ti, Cr, and Ni can be used.

In the description of the above examples, the conductive thin films, the adhesive layers, and the dielectric thin films are formed by sputtering. The method of forming the conductive thin films, the adhesive layers, and the dielectric thin films are not limited to the sputtering method. Rather, various thin film formation methods such as vacuum evaporation, CVD, laser abrasion, and ion plating can be employed to form the thin films.

Also, in the description of the above examples, the adhesive layers are placed at all of the interfaces between the dielectric substrate and the conductive thin film formed on it, and the interfaces between the conductive thin films and the dielectric thin films. Sometimes, the adhesive layers may not be required to be placed at every interface. The interfaces where the adhesive layers are placed can be determined according to the need.

In the description of the above examples 1 and 2, the five layers of conductive thin films alternate with the dielectric thin films. The number of the multilayered layers is not limited to this number. The number can be made greater or smaller than the above-described number of multilayered layers.

With respect to other points, the present invention is not limited to the above examples. Various changes and modifications may be made to the dielectric material of the dielectric substrate, the kind of the conductive material of the conductive thin films, the thickness of the adhesive layers, and so on within the scope of the spirit of the invention.

As described above, in the thin-film multilayered electrode according to the invention, an adhesive layer or layers of great adhesion strength are placed in the position of at least one of the interfaces between a dielectric substrate and a conductive thin film formed on it and/or the interfaces between conductive thin films and dielectric thin films. The strength of adhesion between the successive thin films forming the thin-film multilayered electrode is increased. This can enhance the reliability of the electrode.

Where the thin-film multilayered electrode according to the present invention is applied to an RF electromagnetically coupled thin-film multilayered electrode or the like used in a TM mode resonator or microstrip line resonator, it is assured that a reliable thin-film multilayered electrode can be obtained. This gives rise to an especially meaningful result.

In the thin-film multilayered electrode according to the present invention, at least one species selected from the group consisting of Ti, Cr, Ni, and alloys containing at least one of them is used as the material of the adhesive layers. This assures that the adhesion strength can be improved. Hence, the present invention can be made more effective.

Furthermore, by setting the thickness of the adhesive layers to more than 20 nm, large and stable adhesion strength can be secured. This can make the present invention more effective.

Conductive thin films, adhesive layers, dielectric thin films are continuously formed in a vacuum without breaking the vacuum during the manufacturing steps. This assures that a thin-film multilayered electrode having a low resistivity is manufactured while preventing the conductive thin films and the adhesive layers from oxidizing.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A thin-film multilayered electrode of a high frequency electromagnetic field coupled type, comprising:

a plurality of thin-film conductors and dielectric thin films alternately stacked on a dielectric substrate so as to form a plurality of TEM mode transmission lines, each pair of thin-film conductors and the dielectric thin film sandwiched therebetween constituting a TEM mode transmission line;

wherein each of the dielectric thin films has a predetermined film thickness based on a number of layers of the thin-film conductors and the dielectric thin films, so that phase velocities of TEM waves which propagate through at least two of the plurality of TEM mode transmission lines are made substantially equal to each other;

wherein each of the thin-film conductors has a predetermined film thickness based on the number of layers of the thin-film conductors and the dielectric thin films, such that said predetermined film thickness is smaller than a skin depth of a predetermined frequency which is to be used, so that electromagnetic fields of at least two of the plurality of TEM mode transmission lines are coupled with each other;

wherein at least one of the thin-film conductors further includes at least one adhesive layer having a large adhesion strength at one or more of the interfaces between the dielectric substrate and the thin-film conductor and the interfaces between the thin film conductors and the dielectric thin films; and wherein the adhesive layer is made of at least one kind of material selected from the group consisting of Ti, Cr, Ni, and alloys containing at least one of them.

2. The thin-film multilayered electrode according to claim 1, wherein the adhesive layer has a thickness of more than about 20 nm.

3. A thin-film multilayered electrode of a high frequency electromagnetic field coupled type, comprising:

a plurality of thin-film conductors and dielectric thin films alternately stacked on a dielectric substrate so as to form a plurality of TEM mode transmission lines, each pair of thin-film conductors and the dielectric thin film sandwiched therebetween constituting a TEM mode transmission line;

wherein each of the dielectric thin films has a predetermined film thickness based on a number of layers of the thin-film conductors and the dielectric thin films, so that phase velocities of TEM waves which propagate through at least two of the plurality of TEM mode transmission lines are made substantially equal to each other;

wherein each of the thin-film conductors has a predetermined film thickness based on the number of layers of the thin-film conductors and the dielectric thin films, such that said predetermined film thickness is smaller than a skin depth of a predetermined frequency which is to be used, so that electromagnetic fields of at least two of the plurality of TEM mode transmission lines are coupled with each other;

wherein at least one of the thin-film conductors further includes at least one adhesive layer having a large adhesion strength at one or more of the interfaces between the dielectric substrate and the thin-film conductor and the interfaces between the thin film conductors and the dielectric thin films: and wherein the adhesive layer has a thickness of more than about 20 nm.

4. A thin-film multilayered electrode of a high frequency electromagnetic field coupled type, comprising:

a plurality of thin-film conductors and dielectric thin films alternately stacked on a dielectric substrate so as to form a plurality of TEM mode transmission lines, each pair of thin-film conductors and the dielectric thin film sandwiched therebetween constituting a TEM mode transmission line;

wherein at least one of the thin-film conductors further includes at least one adhesive layer having a large adhesion strength at one or more of the interfaces between the dielectric substrate and the thin-film conductor and the interfaces between the thin film conductors and the dielectric thin films; and wherein the adhesive layer is made of at least one kind of material selected from the group consisting of Ti, Cr, Ni, and alloys containing at least one of them.

5. The thin-film multilayered electrode according to claim 4, wherein the adhesive layer has a thickness of more than about 20 nm.

6. A thin-film multilayered electrode of a high frequency electromagnetic field coupled type, comprising:

a plurality of thin-film conductors and dielectric thin films alternately stacked on a dielectric substrate so as to form a plurality of TEM mode transmission lines, each pair of thin-film conductors and the dielectric thin film sandwiched therebetween constituting a TEM mode transmission line;

wherein at least one of the thin-film conductors further includes at least one adhesive layer having a large adhesion strength at one or more of the interfaces between the dielectric substrate and the thin-film conductor and the interfaces between the thin film conductors and the dielectric thin films; and wherein the adhesive layer has a thickness of more than about 20 nm.

* * * * *